US012683590B2

(12) United States Patent
Wang

(10) Patent No.: US 12,683,590 B2
(45) Date of Patent: Jul. 14, 2026

(54) TUNING DEVICE, SYSTEM AND METHOD

(71) Applicant: Infineon Technologies AG, Neubiberg (DE)

(72) Inventor: Kun Wang, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 327 days.

(21) Appl. No.: 18/496,364

(22) Filed: Oct. 27, 2023

(65) Prior Publication Data

US 2024/0146289 A1    May 2, 2024

(30) Foreign Application Priority Data

Oct. 28, 2022    (EP) ..................................... 22204429

(51) Int. Cl.
    *H03K 5/00*        (2006.01)
    *H01Q 23/00*       (2006.01)
    *H03K 5/1252*      (2006.01)
    *H03H 11/02*       (2006.01)
(52) U.S. Cl.
    CPC ........... *H03K 5/1252* (2013.01); *H01Q 23/00* (2013.01); *H03H 11/02* (2013.01)

(58) Field of Classification Search
    CPC ...... H03K 5/1252; H01Q 23/00; H01Q 5/328; H03H 11/02; H03H 7/38; H03H 7/1775; H03J 3/20; H03J 3/22; H03J 5/02
    See application file for complete search history.

(56) References Cited

U.S. PATENT DOCUMENTS

| | | | | |
|---|---|---|---|---|
| 10,680,574 B1 * | 6/2020 | Hrivnak | ............... | H04B 1/0458 |
| 2015/0054698 A1 * | 2/2015 | Kerr | ........................ | H01Q 5/328 |
| | | | | 343/745 |
| 2019/0013790 A1 * | 1/2019 | Ayranci | ............... | H04B 1/0053 |
| 2021/0234561 A1 * | 7/2021 | De Jongh | ............ | H04B 1/0458 |
| 2021/0305702 A1 * | 9/2021 | Li | ........................... | H01Q 5/335 |

FOREIGN PATENT DOCUMENTS

WO    WO-2015157085 A1 * 10/2015    ............. H04B 1/123

* cited by examiner

*Primary Examiner* — Ping Y Hsieh
(74) *Attorney, Agent, or Firm* — Slater Matsil, LLP

(57)    ABSTRACT

In accordance with an embodiment, A device includes: a first node configured to be coupled to a component to be tuned; a second node configured to be coupled to an inductor; a path including a capacitor coupling the first node and the second node; and a first switch coupled between the second node and a ground node.

20 Claims, 7 Drawing Sheets

TUNING DEVICE, SYSTEM AND METHOD

This application claims the benefit of European Patent Application No. 22204429, filed on Oct. 28, 2022, which application is hereby incorporated herein by reference.

TECHNICAL FIELD

The present application relates to devices, methods and systems relating to a tuning device, system and method.

BACKGROUND

In radio frequency applications, tuning circuits are coupled to an antenna for antenna tuning. Tuning in this respect relates to a process of adapting a component to tuned, e.g. the antenna, to a frequency band where the component is to be used. For example, for tuning the antenna may be selectively coupled to ground via an inductor or decoupled from ground, thus tuning the antenna. Also, in other radio frequency applications, similar tuning approaches where a component to be tuned is selectively coupled to ground via an inductor are known.

With increasing miniaturization in mobile devices like smartphones, the form factor, i.e. size, of the antenna is becoming smaller and smaller, and the bandwidth of the antenna is reduced correspondingly. In order to still tune the antenna to a desired frequency band, inductors having a comparatively high inductance, for example of the order of 20 to 40 nH, are used. Furthermore, the radio frequency voltage at a tuning point which is selectively coupled to ground via the inductor or a plurality of inductors also increases due to the reduced size of the antenna. This in some applications may cause problems such as LC resonance problems and higher radio frequency voltage acting on one or more switches used for the antenna tuning, thus stressing the switches.

The resonance issue in some conventional approaches is solved by using a so-called resonance stopper type antenna tuning switch, which, however, leads to a higher power loss in a mode where the antenna is coupled to ground via the inductor. Furthermore, the higher radio frequency voltage mentioned above sometimes requires a stacking of transistors for implementing the switch, which leads to higher losses and higher capacitance in off-mode, i.e. when the switch for selectively coupling the antenna to ground is switched off. The harmonics of the switch thus implemented are also higher when stressed by a higher RF voltage.

SUMMARY

According to an embodiment, a device is provided that includes: a first node configured to be coupled to a component to be tuned, a second node configured to be coupled to an inductor, a path including a capacitor coupling the first node and the second node, and a first switch coupled between the second node and a ground node.

According to a further embodiment, a system is provided, comprising the device as defined above, the component to be tuned and the inductor. The first node is coupled to the component to be tuned, the second node is coupled to a first end of the inductor, and the second end of the inductor is coupled to the component to be tuned.

In a further embodiment, a method is provided, comprising: providing a device or system as mentioned above; and selectively operating the first switch for tuning.

The above summary merely is intended to give a brief overview over some embodiments and is not to be construed as limiting in any way, as other embodiments may include other features than the ones discussed above.

DETAILED DESCRIPTION OF ILLUSTRATIVE EMBODIMENTS

Figures 1, 2A, 2B, 2C:
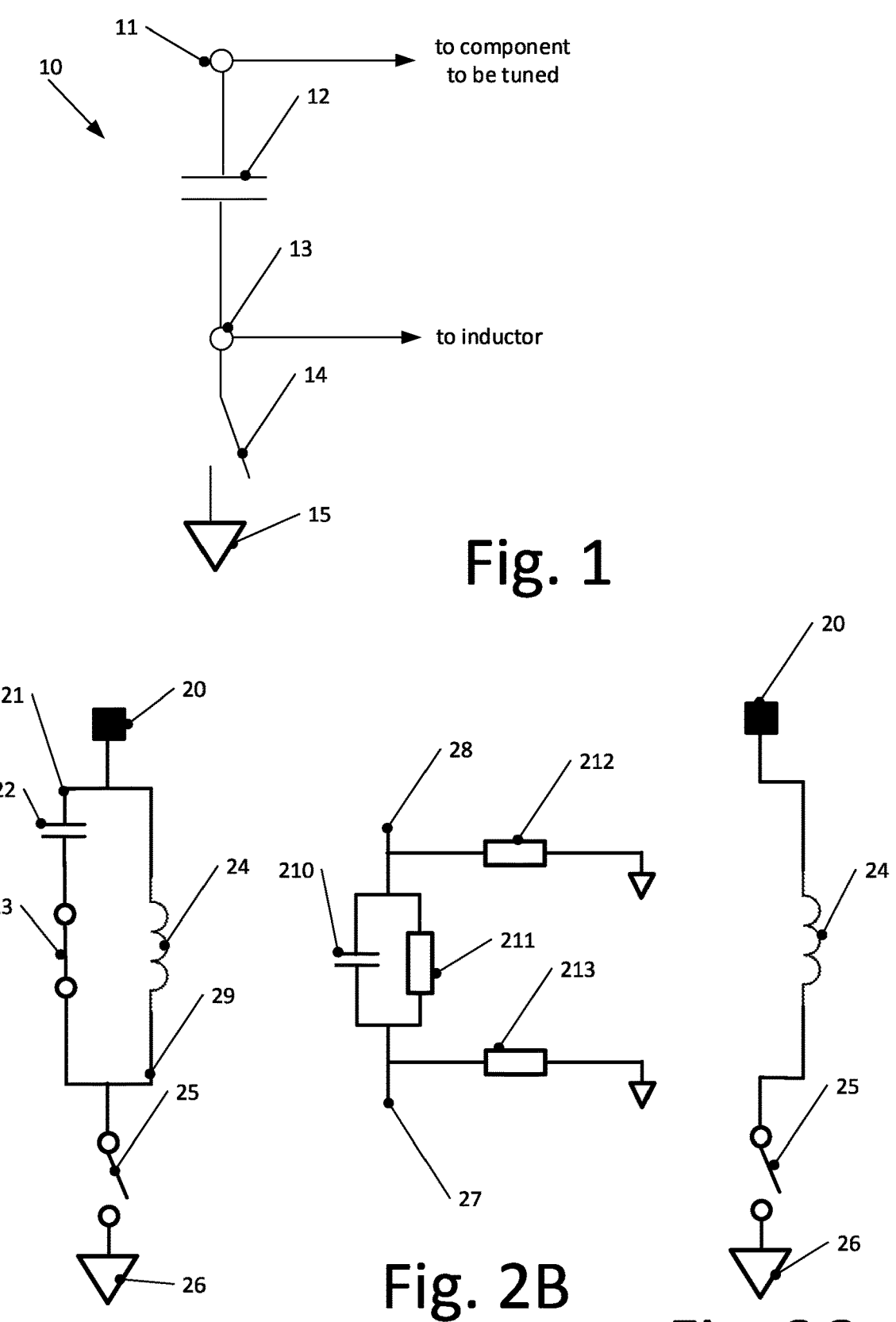
FIG. 1 is a circuit diagram of a device according to an embodiment.
FIG. 2A is a circuit diagram of a device according to an embodiment.
FIG. 2B is an equivalent circuit used for representing switches in simulations.
FIG. 2C is a diagram of a device according to a comparative example.

In the following, various embodiments will be described in detail referring to the attached drawings. These embodiments are given for illustration purposes and are not to be construed as limiting in any way. For example, while embodiments may include a plurality of features (components, elements, acts, events, devices, etc.), in other embodiments, some of these features may be omitted or replaced by alternative features. In addition to the features explicitly shown and described, other features, for example features used in conventional radio frequency devices or systems and tuning circuits or devices may be provided.

Variations or modifications described with respect to one of the embodiments are also applicable to other embodiments unless noted otherwise and therefore will not be described repeatedly. Features from different embodiments may be combined unless noted otherwise. The same reference numerals used in different drawings indicate the same, like, equivalent or similar elements, and such elements will also not be described repeatedly in detail.

Connections or couplings described herein or shown in the drawings refer to electrical connections or couplings unless noted otherwise. Such connections or couplings may be modified, for example by providing additional elements or by removing elements, as long as the general purpose of the connection or coupling is maintained, for example to provide a certain kind of control, to transmit a signal, to provide a selective coupling, to provide a voltage or current and the like.

Switches discussed in the embodiments below may be on or off. When the switch is on, also referred to as on-state or closed state, it provides a low-ohmic electrical connection between its terminals, and when the switch is off, also referred to as off-state or open state, it provides essentially an electrical isolation (possibly apart from leakage currents, depending on the switch design) between its terminals. Switches may for example be implemented using transistors like bipolar junction transistors, field effect transistors or insulated gate bipolar transistors, in any conventional manner. To provide higher voltage handling capabilities, transistors may be stacked, i.e. coupled in series, to implement a switch. To provide a higher current handling capability, transistors may be coupled in parallel.

Capacitors discussed in the embodiments below may be single capacitors, an array of the capacitors, tunable capacitors, a capacitor block, etc. Likewise, inductors discussed in the embodiments below may be single inductors, but may also be formed by an array of inductors or the like.

Turning now to the drawings, FIG. 1 represents a device 10 according to an embodiment.

Device 10 of FIG. 1 includes a first node 11 which, when the device 10 is used for tuning, is coupled to a component to be tuned. The component to be tuned may be an antenna or another radio frequency (RF) device component like an RF frontend.

Furthermore, device 10 comprises a second node 13 to be coupled to an inductor, specifically to a first end of an inductor. The second end of the inductor may be coupled to the component to be tuned.

First node 11 is coupled to second node 13 via a path including a capacitor 12. As will be explained further below, the path may include further components, like a switch. Furthermore, second node 13 is coupled to a ground node 15 via a first switch 14. For tuning, first switch 14 may be selectively switched on or off. In a switched-on state, for example the component to be tuned may be coupled to ground (ground node 15) via the inductor, and when switch 14 is off, the inductor is decoupled from ground. Examples for systems employing such tuning will be described further below referring to FIGS. 6A to 6D.

By using the path between first node 11 and second node 13 including a capacitor like capacitor 12, properties of device in off-mode, i.e. when switch 14 is open, may be improved. This will now be further explained referring to FIGS. 2A to 2D.

FIG. 2A illustrates a device according to an embodiment used for the explanations below. The device of FIG. 2A include a terminal 20 to be coupled to a component to be tuned like an antenna. Furthermore, the device includes a first node 21 and a second node 29. First node 21 is coupled to second node 29 via a path including a capacitor 22 coupled in series to a second switch 23. First node 21 essentially corresponds to first node 11 of FIG. 1, second node 29 of FIG. 2A essentially corresponds to second node 13 of FIG. 1, and capacitor 22 of FIG. 2A essentially corresponds to capacitor 12 of FIG. 1.

Second node 29 is coupled to a first end of an inductor 24. A second end of inductor 24 is coupled to terminal 20 and thus, in operation, to the component to be tuned.

Furthermore, second node 29 is coupled via a first switch 25 to a ground node 26 via a first switch 25. First switch 25 corresponds to first switch 14 of FIG. 1, and ground node 26 corresponds to ground node 15 in FIG. 1.

For tuning the component to be tuned, first switch 25 may be selectively opened or closed to couple or decouple terminal 20 and thus the component to be tuned to ground node 26 via inductor 24. In some embodiments, when switch 25 is open, switch 23 is closed, thus coupling capacitor 22 in parallel to inductor 24. Furthermore, in some embodiments, when switch 25 is closed switch 23 is open, which decreases the influence of capacitor 22 in the state where switch 25 is closed. However, other configurations are also possible. For example, both switches 25 and 23 may be closed, or both switches 25 and 23 may be open in some situations. In some embodiments, switches 25, 23 may be designed such that an on-resistance of first switch 25 is larger than an on-resistance of second switch 23, an off-capacitance of first switch 25 is lower than an off-capacitance of second switch 23, and off-resistance of first switch 25 is larger than an off-resistance of second switch 23. Such design requirements may for example be fulfilled by dimensioning transistors for implementing the switches accordingly.

FIG. 2B illustrates an equivalent circuit of a switch used in circuit analysis simulations which will be discussed further below. Reference numerals 27 and 28 designate the terminals of the switch. Each terminal has a parasitic resistance to ground, resistance 212 for terminal 28 and resistance 213 for terminal 27. The connection between terminals 27 and 28 is represented by a resistor 211 and a (parasitic) capacitor 210. The values of resistors 211 to 213 and of capacitor 210 is selected differently depending on whether the switch is open or closed. For example, for an open connection, a low-ohmic value for resistor 211 is selected, and for an open-state a high-ohmic value representing the electrical isolation between terminals 27, 28 is selected.

FIG. 2C shows a comparative example without the path including capacitor 22 and switch 23. Otherwise, FIG. 2C corresponds to FIG. 2A.

Figure 2D:
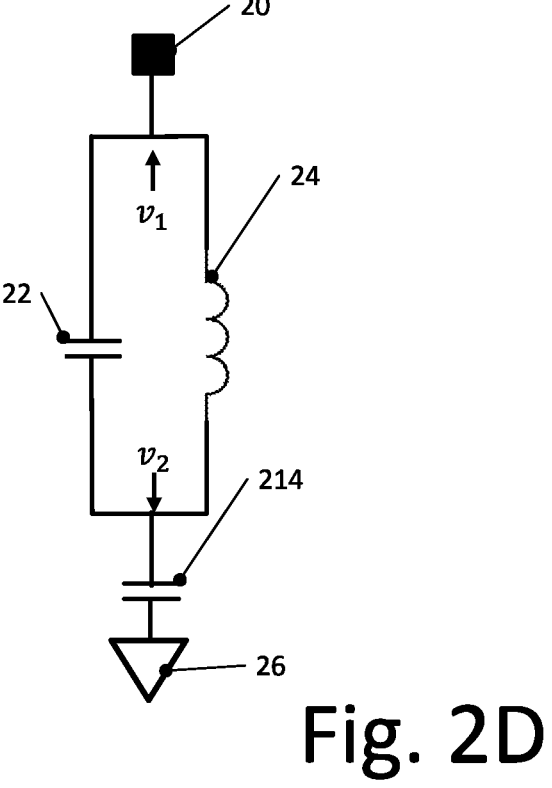
FIG. 2D is a simple equivalent circuit diagram representing the device of FIG. 2A in an off-state of a switch.

FIG. 2D shows a simple equivalent circuit for the device of FIG. 2A when, as shown in FIG. 2A, first switch 25 is open and second switch 23 is closed. Here, instead of the more complex equivalent circuit of FIG. 2B, first switch 25 is represented by a capacitor 214, and second switch 23 is represented by a simple connection with assumed zero resistance. v1 denotes a voltage at first node 21 of FIG. 2A, and v2 denotes a voltage at second node 29 of FIG. 2A. FIG. 2D now is used for a simple preliminary analysis.

The relationship between v1 and v2 is $$\frac{v_1}{v_2} = \frac{1 - \omega^2 (C_{OFF2} + C_1) L_1}{1 - \omega^2 C_1 L_1}$$

In the above equation, $L_1$ is the inductance of inductor 24, $C_1$ is the capacitance of capacitor 22, $C_{OFF2}$ is the capacitance of capacitor 214 of FIG. 2D (i.e. the off-capacitance of first switch 25), and $\omega$ is the frequency of an RF signal applied at terminal 20. To give an example numerical value, with $C_{OFF2}$=0.22 pF, $C_1$=3 pF, and $L_1$=36 nH, the ratio between $v_1$ and $v_2$ at a frequency of 1 GHz is 1.1, which means that first switch 25 of FIG. 2A in the off-state is stressed with the voltage $v_2$ which is about 10% less than the RF voltage at terminal 20 (i.e. $v_1$). Without the provision of capacitor 22, i.e. without $C_1$ in the above formula, the ratio is 0.7, which means that due to LC resonances the voltage $v_2$ may be about 30% higher than the RF voltage at terminal 20, which means a higher stress for first switch 25 which has to be dimensioned accordingly.

Furthermore, the off-capacitance of the circuit in the state of FIG. 2A, i.e. with first switch 25 open, as seen by the component to be tuned (coupled to terminal 20) is reduced. The total off-capacitance seen, $C_{TOTAL}$, may be written as:

$$C_{TOTAL} = \frac{(\omega^2 L_1 C_1 - 1) C_{OFF2}}{\omega^2 (C_{OFF2} + C_1) L_1 - 1}$$

Taking the values given above as examples, the off-capacitance $C_{TOTAL}$ is 200 fF at 1 GHz, which is 10% lower than the off-capacitance of first switch 25 in the numerical example given (0.22 pF=220 fF). For the case without capacitor 22, the capacitance $C_{TOTAL}$ is 320 fF at 1 GHz, which is 60% higher than the off-capacitance of first switch 25 alone. Therefore, due to the provision of capacitor 22, the total off-capacitance may be reduced.

It should be noted that the above numerical values are given only by way of example, and while they are typical values, they may vary depending on the particular implementation. This also applies to other numerical values given herein.

The above analysis has been verified using circuit simulations of the circuits shown in FIG. 2A, as an embodiment, and 2C, as a comparative example, taking the equivalent circuit of FIG. 2B for the switches. For simulating switch 25 in an off-state as in FIGS. 2A and 2C, in the equivalent circuit of FIG. 2B resistors 212, 214 were set to 40 kΩ, capacitor 210 was set to 0.22 pF, and resistor 211 was set to 60 kΩ. For simulating closed switch 23 as in FIG. 2A, resistors 212, 213 were set to 200 kΩ, capacitor 210 was set to 0.045 pF, and resistor 211 was set to 7.5Ω. Again, these are only example values used for simulations, and while representing typical values they may vary depending on implementation.

A simulation where an RF signal with a peak voltage of 60 V and a frequency of 800 MHz was applied to terminal 20 for FIGS. 2A and 2C resulted in a maximum voltage of 54 V at second node 29 applied to first switch 25 in FIG. 2A and a peak voltage of 75 V applied to first switch 25 in case of FIG. 2C. Therefore, verifying the above numerical analysis, also the simulation resulted in a decrease of the voltage with which first switch 25 is stressed compared to the RF voltage applied, compared to an increase for the conventional arrangement of FIG. 2C. This reduction in voltage not only reduces the stress on first switch 25, but in some embodiments may also reduce harmonics generated by the device, in the above numerical examples for example by 10 dB. Furthermore, with the above values, simulations yielded an off capacitance (CTOTAL in the discussion above of FIG. 2D) of 200 fF for FIG. 2A and 276 fF for FIG. 2C. Therefore, also the off-capacitance as seen by the component to be tuned, for example antenna, is reduced, leading to a reduced detuning due to the off-capacitance. Furthermore, simulations resulted in an off-resistance for the device as seen by the antenna of 16.3 kΩ for FIG. 2A and 13.5 kΩ for FIG. 2C. This in some implementations may also have beneficial effects, as the power loss approximately inversely proportional to the off-resistance, such that a higher off-resistance implies a smaller power loss. Therefore, as discussed above, providing the path including a capacitance (capacitor 12 of FIG. 1 or capacitor 22 of FIGS. 2A to 2D) may, in some embodiments, lead to improved properties of the device, as discussed above.

Figure 3:
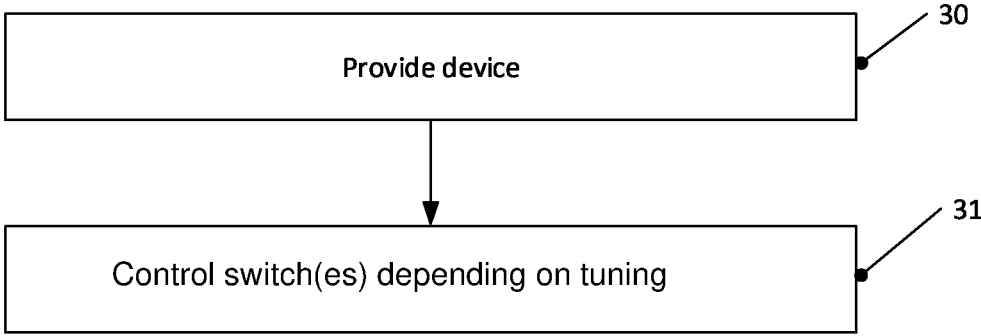
FIG. 3 is a flowchart illustrating a method according to an embodiment.

FIG. 3 is a flowchart illustrating a method according to an embodiment.

At 30, the method comprises providing a device as described above or as described further below coupled to an inductor and an element to be tuned, for example an antenna, as discussed. At 31, the method comprises controlling one or more switches of the device for tuning, for example switch 14 of FIG. 1 or switches 25, 23 of FIG. 2A. In case two switches are provided as in FIG. 2A, the control at 31 may be such that when one switch is open, the other one is closed and vice versa, although other switch configurations may also be used.

Next, variations of the device and configuration shown in FIG. 2A will be discussed with reference to FIGS. 4A, 4B and FIGS. 5A to 5E. Elements corresponding to those already discussed with reference to FIG. 2A bear the same reference numerals and will not be discussed again.

Figure 4A:
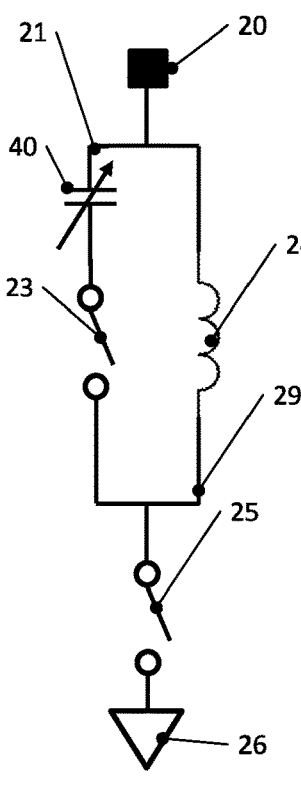
FIGS. 4A and 4B show devices according to various embodiments.

In the embodiment of FIG. 4A, compared to FIG. 2A, capacitor 22 is replaced by a variable capacitor 40. Such a variable capacitor may for example be implemented as a switchable capacitor array. Other types of tunable capacitors may also be used. When capacitor 40 is tunable, its capacitance may be adjusted depending on tuning, for example depending on state of switches 25, 23.

Figure 4B:
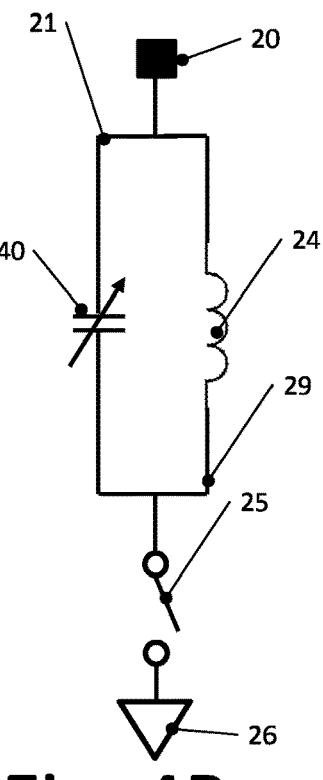

In FIG. 4B, also tunable capacitor 40 is provided, and second switch 23 has been omitted. In the embodiment of FIG. 4B, for example a capacitance of tunable capacitor 40 may be tuned depending on the state of first switch 25, for example to a higher capacitance when first switch 25 is closed and a lower capacitance when first switch 25 is open.

The capacitor (capacitor 22 or capacitor 40) may be integrated with switch 25 and also switch 23 (if provided), in a common integrated circuit, or may be provided as a component outside such an integrated circuit. The corresponding inductor like inductor 24 typically is provided outside the integrated circuit to be able to provide a higher inductance, but may also be integrated in the same integrated circuit. Various examples for such integrations and further variations will be described referring to FIGS. 5A to 5E. The embodiments of FIGS. 5A to 5E are variations of the embodiments discussed referring to FIGS. 2A, 4A and 4B, and again corresponding elements bear the same reference numerals and will not be described again in detail.

Figure 5A:
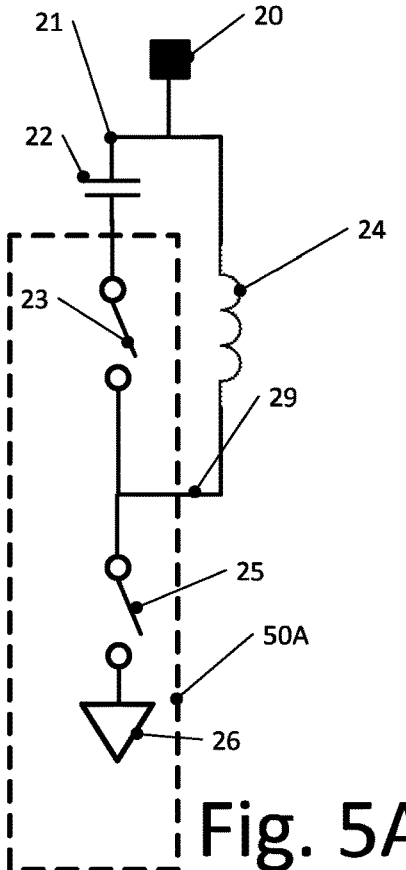
FIGS. 5A to 5E show devices according to some further embodiments.
Figure 5B:
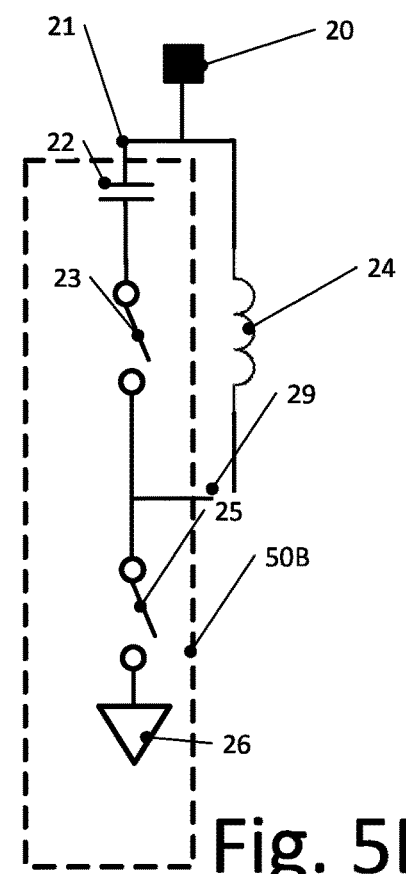

In FIG. 5A, first switch 25 and second switch 23 are integrated in an integrated circuit 5A, while capacitor 22 is outside the integrated circuit 50A. In FIG. 5B, capacitor 22 together with switches 23, is integrated in an integrated circuit 50B.

Figures 5C, 5D, 5E:
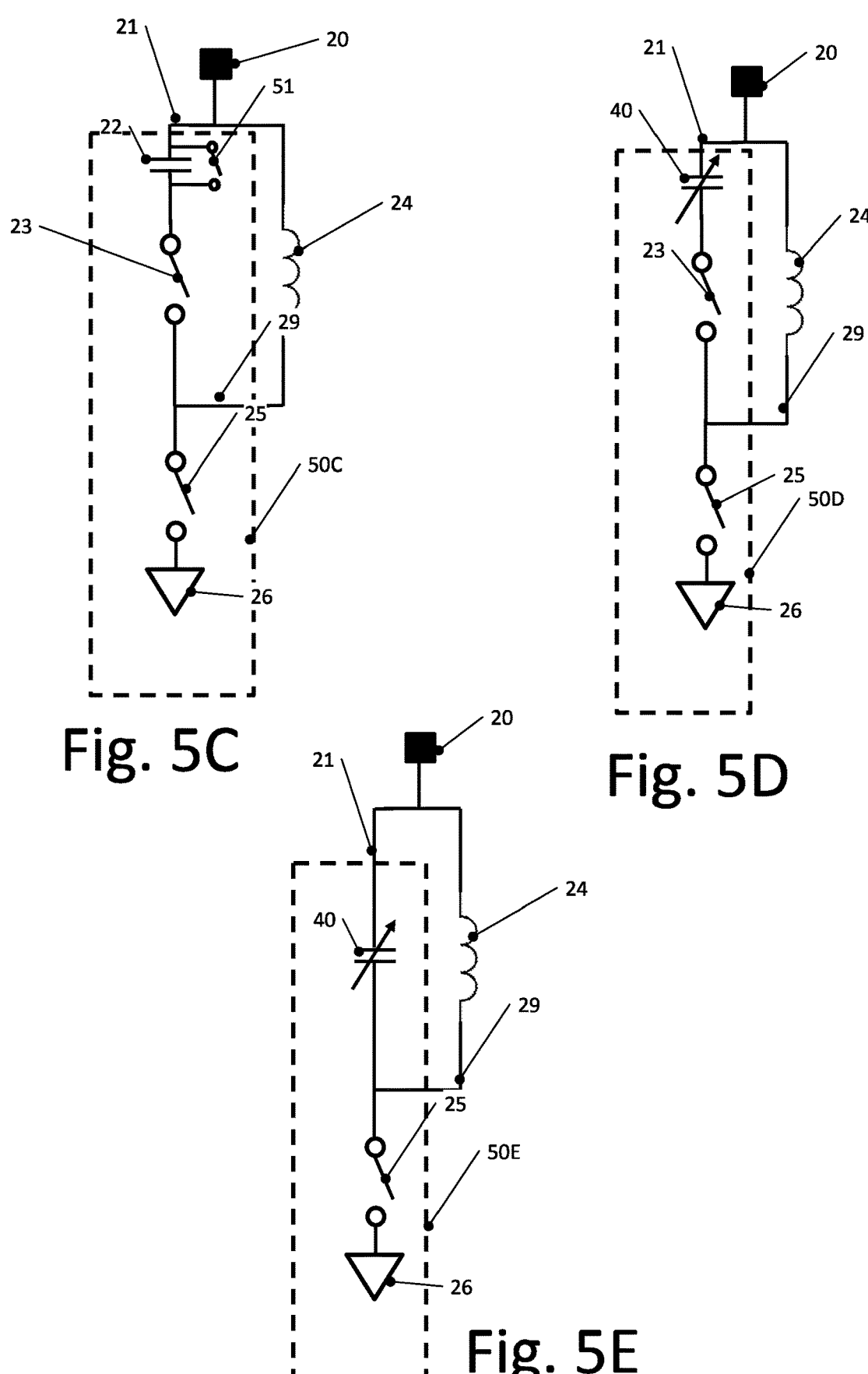

In FIG. 5C, in an integrated circuit 50C, in addition to the components of integrated circuit 50B of FIG. 5B a third switch 51 is provided in parallel to capacitor 22. With third switch 51, capacitor 22 may be short circuited, for example when first switch 25 is closed and second switch 23 is open.

In FIG. 5D, in an integrated circuit 50D compared to FIG. 5B instead of capacitor 22 tunable capacitor 40 is integrated. It should be noted that tunable capacitor 30 may also be provided outside an integrated circuit, for example instead of capacitor 22 in FIG. 5A, or may be provided with a parallel third switch like third switch 51 of FIG. 5C, such that FIGS. 5A to 5E only show some configuration examples.

In FIG. 5E, in an integrated circuit 50E compared to FIG. 5D second switch 23 is omitted (similar to the embodiment of FIG. 4B). Also here, instead of tunable capacitor 40 capacitor 22 with a fixed capacitance value may be provided.

In the embodiments discussed above, a single path between a respective terminal (for example terminal 20) and a ground node via an inductor (inductor 24, for example) is provided. In some tuning applications, a plurality of such paths is provided, such that an overall inductance between an element to be tuned and a ground node may be provided. In such embodiments, two or more paths may share a capacitor like capacitor 22 or tunable capacitor 40, or separate capacitors may be provided. Some embodiments of corresponding systems will now be described referring to FIGS. 6A to 6D. Again, features already described previously bear the same reference numerals and will not be discussed again.

Figure 6A:
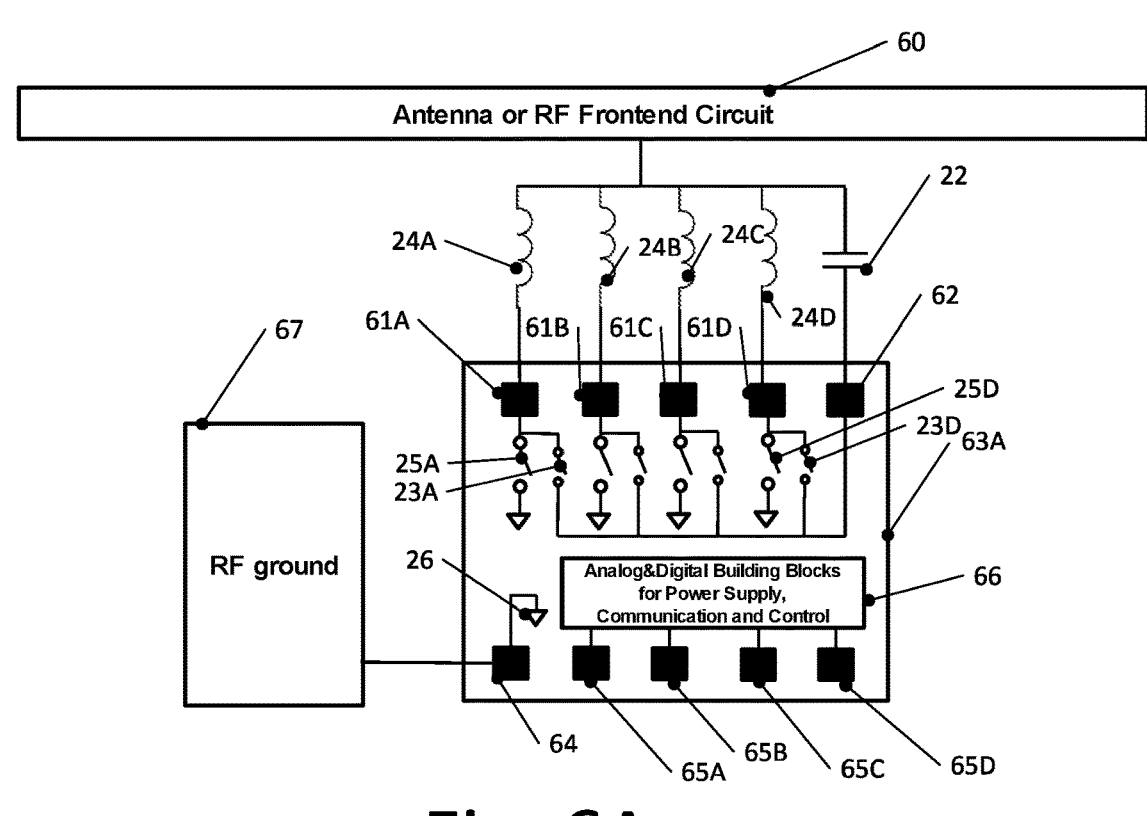
FIGS. 6A to 6D illustrate systems and devices according to various embodiments.

In FIG. 6A, a system according to an embodiment is shown. In the system of FIG. 6A, an antenna or RF frontend circuit 60 is an example for a component to be tuned.

Antenna or RF frontend circuit 60 may for example be part of a mobile device like a smartphone, but is not limited thereto.

For tuning, a plurality of inductors, in the example of FIG. 6A four inductors 24A to 24A, may be selectively coupled to ground 26. Inductors 24A to 24D may have the same or different inductance values. To this purpose, a coupling chip 63A is provided including four first switches 25A to 25D (for clarity's sake, only switches 25A and 25D bear corresponding reference numerals) are provided between respective terminals 61A to 61D and a respective ground node 26. Terminals 61A to 61D are coupled to a first end of a respective one of inductors 24A to 24D, and second ends of inductors 24A to 24D are coupled to antenna or RF frontend circuit 60 as shown.

Ground node 26 is coupled to a radio frequency ground potential 67 via a terminal 64 of chip 63A.

Furthermore, a capacitor 22 is provided, in the example of FIG. 6A, external to chip 63A. Capacitor 22 is coupled between antenna or RF frontend circuit 60 and a terminal 62 of chip 63A. Terminal 62 is coupled to each of terminals 61A to 61D via a respective second switch 23A to 23D as shown, where again only the switches 23A, 23D bear the reference numerals for clarity's sake. For each inductor 24A to 24D, first and second switches 25A to 25D, 23A to 23D have the same function as first and second switches 25, 23 in FIG. 2A, and the coupling is the same as shown in FIG. 2A, with the capacitor 22 shared for all inductors.

Switches 23A to 23D and 25A to 25D are controlled by a block 66, which may include analog and digital building blocks for power supply, communication circuitry and control circuitry. Via terminals 65A to 65D, block 66 may receive a supply voltage, control signals, for example in the form of a data signal or clock signal, identification signals or any other signal conventionally used for controlling devices.

Figure 6B:
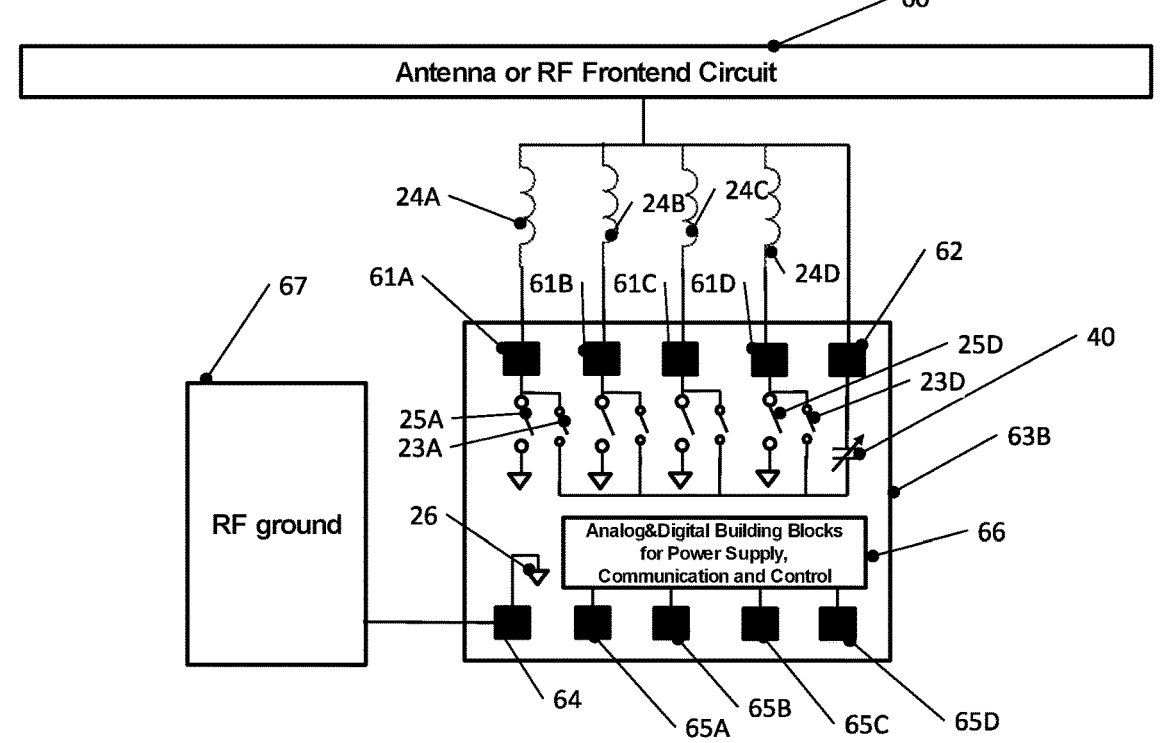
Figure 6C:
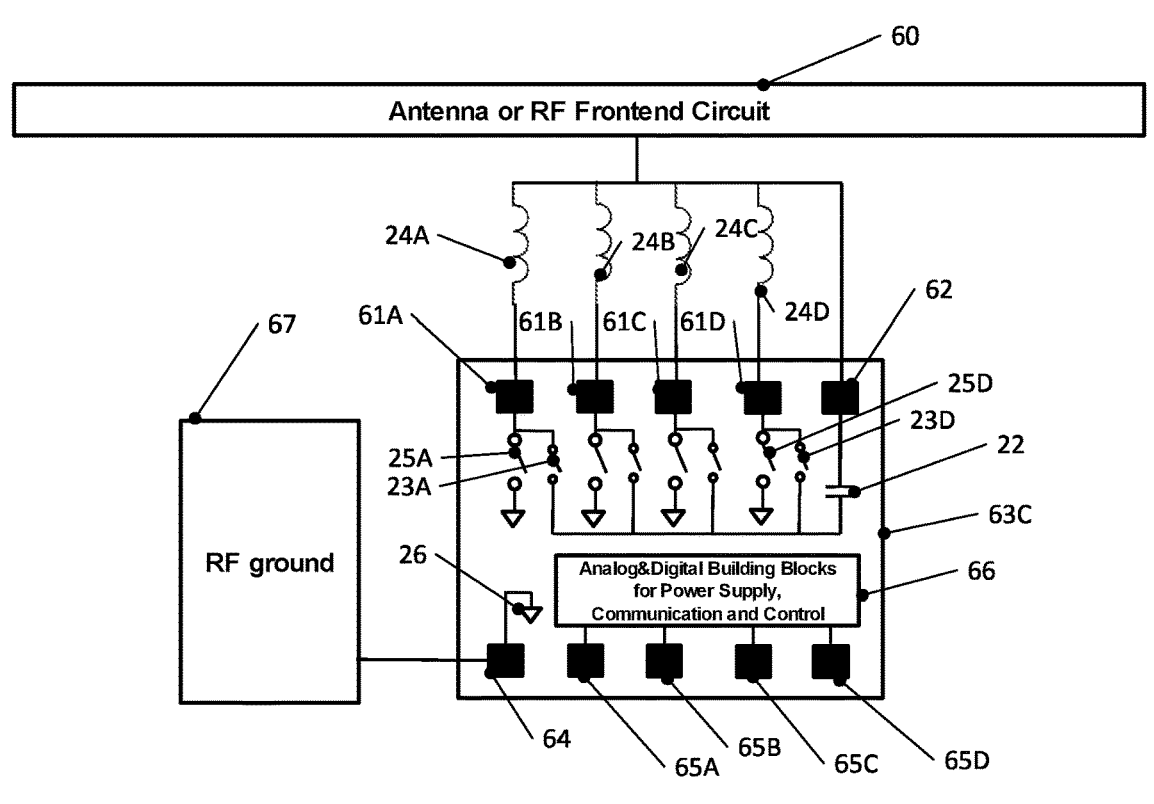
Figure 6D:
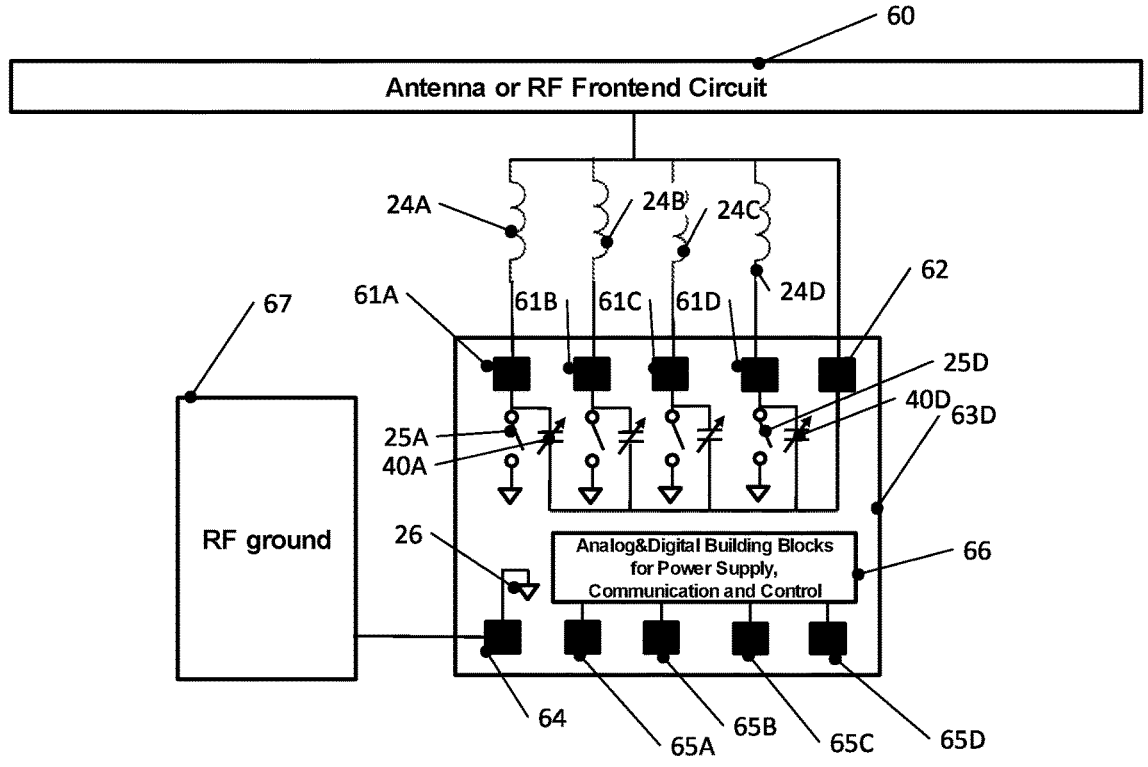

FIGS. 6B to 6D show variations of the system of FIG. 6A. In FIG. 6B, instead of capacitor 22, tunable capacitor 40 is provided inside an integrated circuit 63B. In FIG. 6C, fixed capacitor 22 is provided within integrated circuit 63c.

In FIG. 6D, individual tunable capacitors 40A to 40D are provided for each path, and the respective switches 23A to 23D have been omitted (similar to the embodiment of FIG. 5E). FIGS. 6A to 6D only show some possible variations, and for example also in FIG. 6A instead of capacitor 22, tunable capacitor 40 may be provided outside a corresponding chip, or in FIG. 6D instead of tunable capacitors 40A to 40D, corresponding fixed capacitors may be provided, and/or in FIG. 6D, in addition the second switches 23a to 23d may be provided.

Figure 7:
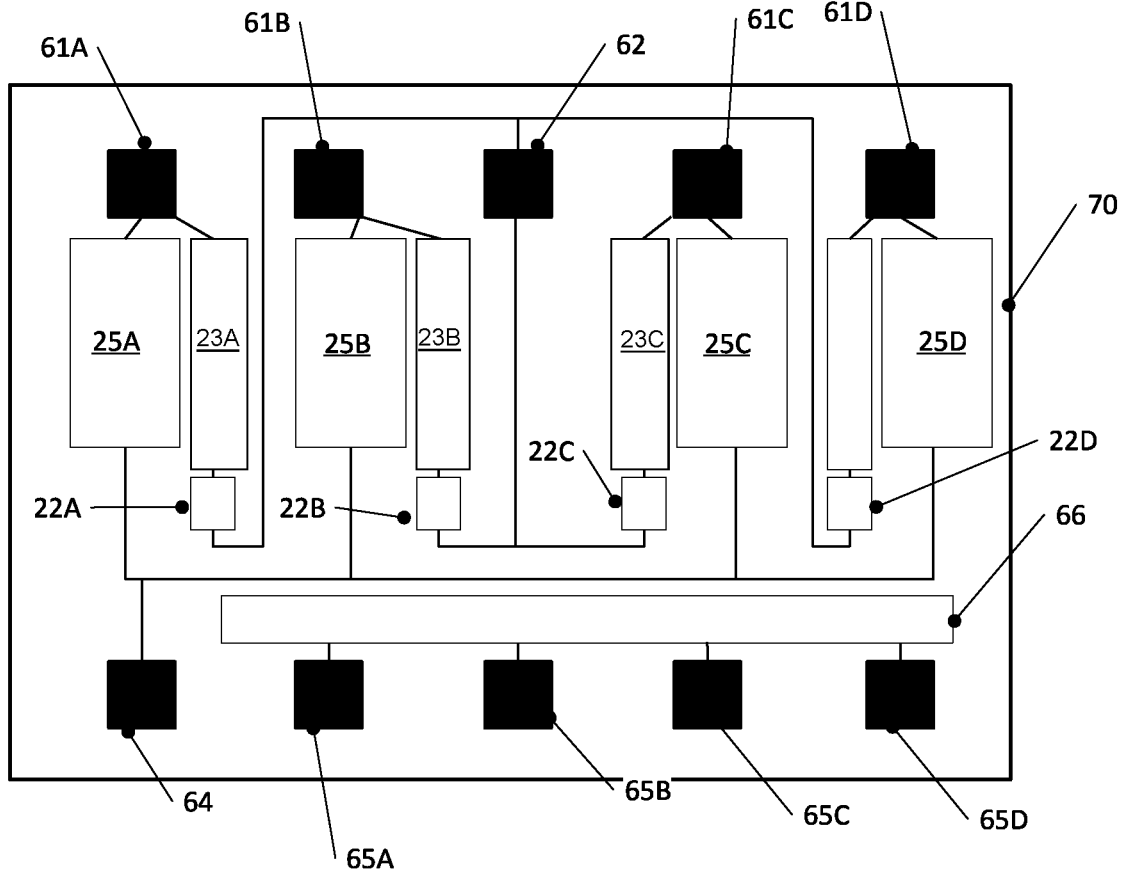
FIG. 7 illustrates in an example layout of a device according to an embodiment.

FIG. 7 shows an example chip layout for an integrated circuit 70, similar to integrated circuit 63a to 63d, where second switches 23A to 23D are provided, and in addition individual fixed capacitors 22A to 22dD are provided for each path. The boxed indicate areas where the corresponding elements are implemented on the chip. The arrangement of FIG. 7 where terminal 62 is provided in the middle between terminal 61A, 61B and 61C, 61D is only an example, and other layouts may also be used. Furthermore, the layout may be adapted to the various implementation possibilities discussed with FIGS. 6A to 6D.

Moreover, while in the embodiments of FIGS. 6A to 6D and 7 four inductors are provided, in other embodiments other numbers of inductors, i.e. less than four inductors or more than four inductors, may be provided.

Some embodiments are defined by the following examples:

Example 1. A device, including: a first node configured to be coupled to a component to be tuned, a second node configured to be coupled to an inductor, a path including a capacitor coupling the first node and the second node, and a first switch coupled between the second node and a ground node.

Example 2. The device of example 1, further including a second switch coupled in series with the capacitor between the first node and the second node.

Example 3. The device of example 1 or 2, further including a third switch coupled in parallel to the capacitor.

Example 4. The device of any one of examples 1 to 3, where the capacitor includes a tunable capacitor.

Example 5. The device of any one of examples 1 to 4, where the capacitor and the first switch provided in an integrated chip device, wherein the first node is a first terminal of the integrated chip device, and the second node is a second terminal of the integrated chip device.

Example 6. The device of any one of examples 1 to 4, wherein the first switch is provided in an integrated chip device, where the capacitor is provided external to the integrated chip device, where a first terminal of the integrated chip device is coupled to a first end of the capacitor and the first node corresponds to a second end of the capacitor, and where the second node is a second terminal of the integrated chip device.

Example 7. The device of example 6 and of example 2, where the second switch is provided in the integrated chip device, wherein the first terminal is between the capacitor and the second switch.

Example 8. The device of any one of examples 1 to 7, further including: a plurality of second nodes, including the second node, configured to be coupled to a respective one of a plurality of inductors, including the inductor; a plurality of paths, including the path, coupling the first node and a respective one of the second nodes; and a plurality of first switches, including the first switch, each coupled between a respective second node and a ground node.

Example 9. The device of example 8, where each path includes a respective one of a plurality of capacitors, including the capacitor.

Example 10. The device of example 8, where the capacitor is a common capacitor of the plurality of paths.

Example 11. A system, including: the device of any one of examples 1 to 10; the component to be tuned; and the inductor, where the first node is coupled to the component to be tuned, where the second node is coupled to a first end of the inductor, and where a second end of the inductor is coupled to the component to be tuned.

Example 12. The system of example 11, where the component to be tuned includes an antenna.

Example 13. A method, including: providing the device of any one of examples 1 to 10 or the system of example 11 or 12; and selectively operating the first switch for tuning.

Example 14. The method of example 13, where the device is the device as defined in example 2, and further including closing the second switch when the first switch is open, and opening the second switch when the first switch is closed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
a first node configured to be coupled to a component to be tuned and to a first terminal of an inductor;
a second node configured to be coupled to a second terminal of the inductor different from the first terminal;
a first switch coupled between the second node and a ground node; and
a circuit path coupled between the first node and the second node, the circuit path comprising a capacitor coupled in series with a second switch, wherein the second switch is configured to be open when the first switch is closed, the second switch is configured to be closed when the first switch is open, and the capacitor is configured to reduce an effect of a parasitic off capacitance of the first switch at the first node when the first switch is open.

2. The device of claim 1, further comprising a third switch coupled in parallel to the capacitor.

3. The device of claim 1, wherein the capacitor comprises a tunable capacitor.

4. The device of claim 1, wherein:
the capacitor and the first switch are provided in an integrated chip device;
the first node is a first terminal of the integrated chip device; and
the second node is a second terminal of the integrated chip device.

5. The device of claim 1, wherein:
the first switch is provided in an integrated chip device, wherein the capacitor is provided external to the integrated chip device;
a first terminal of the integrated chip device is coupled to a first end of the capacitor and the first node corresponds to a second end of the capacitor; and
the second node is a second terminal of the integrated chip device.

6. The device of claim 5, wherein:
the second switch is provided in the integrated chip device; and
the first terminal is coupled between the capacitor and the second switch.

7. The device of claim 1, further comprising:
a plurality of second nodes, including the second node, configured to be coupled to a second terminal of a respective one of a plurality of inductors that includes the inductor;
a plurality of circuit paths, including the path, coupling the first node and a respective one of the plurality of second nodes; and
a plurality of first switches that includes the first switch, each of the plurality of first switches coupled between the respective one of the plurality of second nodes and the ground node.

8. The device of claim 7, wherein each path includes a respective one of a plurality of capacitors, including the capacitor.

9. The device of claim 7, wherein the capacitor is a common capacitor of the plurality of circuit paths.

10. A system, comprising:
the device of claim 1,
the component to be tuned coupled to the first node; and the inductor having the first terminal coupled to the second node and the second terminal coupled to the component being tuned.

11. The system of claim 10, wherein the component to be tuned comprises an antenna.

12. A method, of tuning a component coupled to a device comprising a first node coupled to a component to be tuned and to a first terminal of an inductor; a second node coupled to a second terminal of the inductor different from the first terminal; a first switch coupled between the second node and a ground node; and a circuit path coupled between the first node and the second node, the circuit path comprising a capacitor coupled in series with a second switch, the method comprising:
opening the second switch and closing the first switch in a first tuning configuration; and
closing the second switch and opening the first switch in a second tuning configuration.

13. The method of claim 12, wherein the capacitor is configured to reduce an effect of a parasitic off capacitance of the first switch at the first node when the first switch is open.

14. The method of claim 12, wherein:
the component is an antenna;
the device further comprises:
a plurality of second nodes, including the second node, configured to be coupled to a respective one of a plurality of inductors that includes the inductor,
a plurality of circuit paths, including the circuit path, coupling the first node and a respective one of the plurality of second nodes, and
a plurality of first switches that includes the first switch, each of the plurality of first switches coupled between the respective one of the plurality of second nodes and the ground node; and
the method further comprises selectively operating the first plurality of first switches.

15. A radio-frequency (RF) system comprising:
an antenna;
a plurality of inductors, each inductor of the plurality of inductors having a first end coupled to the antenna at an antenna node;
a plurality of first switches, each first switch of the plurality of first switches having a first load terminal coupled to a second end of a corresponding inductor of the plurality of inductors and a second load terminal different from the first load terminal;
a plurality of second switches, each second switch of the plurality of second switches having a third load terminal coupled to the second end of the corresponding inductor of the plurality of inductors, and a fourth load terminal different from the third load terminal coupled to an RF ground node; and
a capacitor coupled between the antenna node and the second load terminal of each first switch of the plurality of first switches, wherein the capacitor is configured to reduce an effect of a parasitic off capacitance of each first switch at the antenna node.

16. The system of claim 15, wherein the plurality of first switches and the plurality of second switches are disposed on an integrated circuit.

17. The system of claim 16, further comprising a controller disposed on the integrated circuit and coupled to control nodes of the plurality of first switches and the plurality of second switches.

18. The system of claim 16, wherein the capacitor is disposed on the integrated circuit.

19. The system of claim 15, further comprising a controller configured to:

open one second switch of the plurality of second switches and close a corresponding first switch of the plurality of first switches in a first tuning configuration; and close the one second switch of the plurality of second switches and open the corresponding first switch of the plurality of first switches in the first tuning configuration.

20. The system of claim 15, wherein the capacitor comprises a tunable capacitor.

\* \* \* \* \*